United States Patent
Li et al.

(10) Patent No.: US 11,424,298 B2
(45) Date of Patent: Aug. 23, 2022

(54) DISPLAY PANEL AND DISPLAY DEVICE

(71) Applicant: BOE TECHNOLOGY GROUP CO., LTD., Beijing (CN)

(72) Inventors: Yuanyuan Li, Beijing (CN); Meizhu Zheng, Beijing (CN); Junjie Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 735 days.

(21) Appl. No.: 16/333,303

(22) PCT Filed: Aug. 16, 2018

(86) PCT No.: PCT/CN2018/100728
§ 371 (c)(1),
(2) Date: Mar. 14, 2019

(87) PCT Pub. No.: WO2019/137002
PCT Pub. Date: Jul. 18, 2019

(65) Prior Publication Data
US 2021/0376002 A1   Dec. 2, 2021

(30) Foreign Application Priority Data
Jan. 12, 2018 (CN) .......................... 201810032078.X

(51) Int. Cl.
*G09G 5/00* (2006.01)
*H01L 27/32* (2006.01)
(Continued)

(52) U.S. Cl.
CPC ............ *H01L 27/323* (2013.01); *G06F 3/047* (2013.01); *G06F 3/0412* (2013.01);
(Continued)

(58) Field of Classification Search
CPC ............... H01L 27/323; H01L 51/5268; H01L 27/3234; G06F 3/0445; G06F 3/0443;
(Continued)

(56) References Cited

U.S. PATENT DOCUMENTS 10,825,881 B2 * 11/2020 Sun ..................... H01L 27/3272
2014/0293162 A1 * 10/2014 Park ..................... G06F 1/1626
349/12
(Continued)

FOREIGN PATENT DOCUMENTS

CN          106940488 A       7/2017
CN          107025451 A       8/2017
(Continued)

OTHER PUBLICATIONS

International Search Report and Written Opinion dated Nov. 6, 2018.

*Primary Examiner* — Jennifer T Nguyen
(74) *Attorney, Agent, or Firm* — Dilworth & Barrese, LLP.; Michael J. Musella, Esq.

(57) ABSTRACT

A display panel and a display device are provided. The display panel includes an imaging layer, a pinhole light-shielding layer, a display array layer and a touch layer. The imaging layer, the display array layer and the touch layer are sequentially disposed; the pinhole light-shielding layer is between the imaging layer and the touch layer, and includes light-shielding regions and at least one hole-shaped light-transmitting region that is corresponding to the imaging layer; the display array layer is configured to emit light from a side away from the imaging layer; and the touch layer includes touch mesh patterns formed by conductive wires, and at least one of the touch mesh patterns includes a first mesh corresponding to the hole-shaped light-transmitting region and includes second meshes outside the first mesh, (Continued)

and a size of the first mesh is larger than sizes of the second meshes.

20 Claims, 13 Drawing Sheets

(51) Int. Cl.
    *G06F 3/044*         (2006.01)
    *G06F 3/041*         (2006.01)
    *G06F 3/047*         (2006.01)
    *H01L 51/52*         (2006.01)
    *G06V 40/13*         (2022.01)

(52) U.S. Cl.
    CPC .......... *G06F 3/0443* (2019.05); *G06F 3/0445* (2019.05); *H01L 51/5268* (2013.01); *G06F 2203/04102* (2013.01); *G06F 2203/04112* (2013.01); *G06V 40/1318* (2022.01); *H01L 27/3234* (2013.01)

(58) Field of Classification Search
    CPC .................. G06F 3/0412; G06F 3/047; G06F 2203/04102; G06F 2203/04112; G06K 9/0004
    USPC ......................................................... 345/173
    See application file for complete search history.

(56) References Cited

U.S. PATENT DOCUMENTS

| | | | |
|---|---|---|---|
| 2015/0227233 A1* | 8/2015 | Yi | ......................... G06F 3/0445 345/174 |
| 2017/0124376 A1 | 5/2017 | Wyrwas et al. | |
| 2018/0032188 A1* | 2/2018 | Park | ..................... G06F 3/04164 |
| 2018/0089485 A1* | 3/2018 | Bok | ...................... G06K 9/0002 |
| 2019/0095674 A1* | 3/2019 | Ko | ............................ G02B 6/08 |

FOREIGN PATENT DOCUMENTS

| | | |
|---|---|---|
| CN | 107480639 A | 12/2017 |
| CN | 108183110 A | 6/2018 |

\* cited by examiner

DISPLAY PANEL AND DISPLAY DEVICE

This application claims the benefit of Chinese patent application No. 201810032078.X, filed on Jan. 12, 2018, which is hereby entirely incorporated by reference as a part of the present application.

TECHNICAL FIELD

Embodiments of the present disclosure relates to a display panel and display device.

BACKGROUND

With the rapid development of mobile payment and mobile information communication, there is an increasing demand for convenient and effective security technologies applicable to display devices. Human biometric recognition technologies such as fingerprint recognition technology, palmprint recognition technology and iris recognition technology are gradually used in mobile electronic devices. If a touch display device is provided with a human biometric recognition function such as fingerprint recognition or palmprint recognition by introducing a separate imaging module, the size, weight, cost and power consumption of the touch display device increase, and this is contrary to the current requirements and expectations of consumers on electronic products, in particular, consumer electronic products.

SUMMARY

At least one embodiment of the present disclosure provides a display panel including an imaging layer, a pinhole light-shielding layer, a display array layer and a touch layer. The imaging layer, the display array layer and the touch layer are sequentially disposed; the pinhole light-shielding layer is between the imaging layer and the touch layer, and includes light-shielding regions and at least one hole-shaped light-transmitting region that is corresponding to the imaging layer; the display array layer is configured to emit light from a side away from the imaging layer; and the touch layer includes touch mesh patterns formed by conductive wires, and at least one of the touch mesh patterns includes a first mesh corresponding to the hole-shaped light-transmitting region and includes second meshes outside the first mesh, and a size of the first mesh is larger than sizes of the second meshes.

For example, in at least one example of the display panel, the pinhole light-shielding layer is between the imaging layer and the display array layer.

For example, in at least one example of the display panel, at least one of the touch mesh patterns further includes an auxiliary mesh wire within the first mesh; and an end of the auxiliary mesh wire is connected with the conductive wires forming the first mesh, and another end of the auxiliary mesh wire is suspended.

For example, in at least one example of the display panel, an orthographic projection of the hole-shaped light-transmitting region on the display array layer is within an orthographic projection of the first mesh on the display array layer.

For example, in at least one example of the display panel, a center of the orthographic projection of the hole-shaped light-transmitting region on the display array layer coincides with a center of the orthographic projection of the first mesh on the display array layer.

For example, in at least one example of the display panel, the display array layer includes a plurality of display pixels, and an orthographic projection of the hole-shaped light-transmitting region on the display array layer is between adjacent display pixels.

For example, in at least one example of the display panel, orthographic projections of the conductive wires on the display array layer are between adjacent display pixels, respectively.

For example, in at least one example of the display panel, an orthographic projection of each of the second meshes on the display array layer surrounds at least one corresponding display pixel.

For example, in at least one example of the display panel, a density of the first mesh is smaller than a density of the second meshes.

For example, in at least one example of the display panel, a surface of the conductive wires at a side closer to the imaging layer includes a plurality of scattering points and the scattering points protrude from or dent into the surface.

For example, in at least one example of the display panel, the display panel further includes a base substrate and a drive circuit layer, the drive circuit layer is between the display array layer and the imaging layer, and the imaging layer is at any side of the substrate.

For example, in at least one example of the display panel, at least a portion of the light-shielding regions of the pinhole light-shielding layer is formed by an opaque structure of the drive circuit layer.

For example, in at least one example of the display panel, the touch layer includes: the touch mesh patterns arranged in an array and in a same layer, or the touch mesh patterns in different layers.

For example, in at least one example of the display panel, the display panel further includes an encapsulation layer, the encapsulation layer is between the display array layer and the touch layer, and the encapsulation layer is in direct contact with the touch layer.

At least one embodiment of the present disclosure also provides a display device including the display panel provided by any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
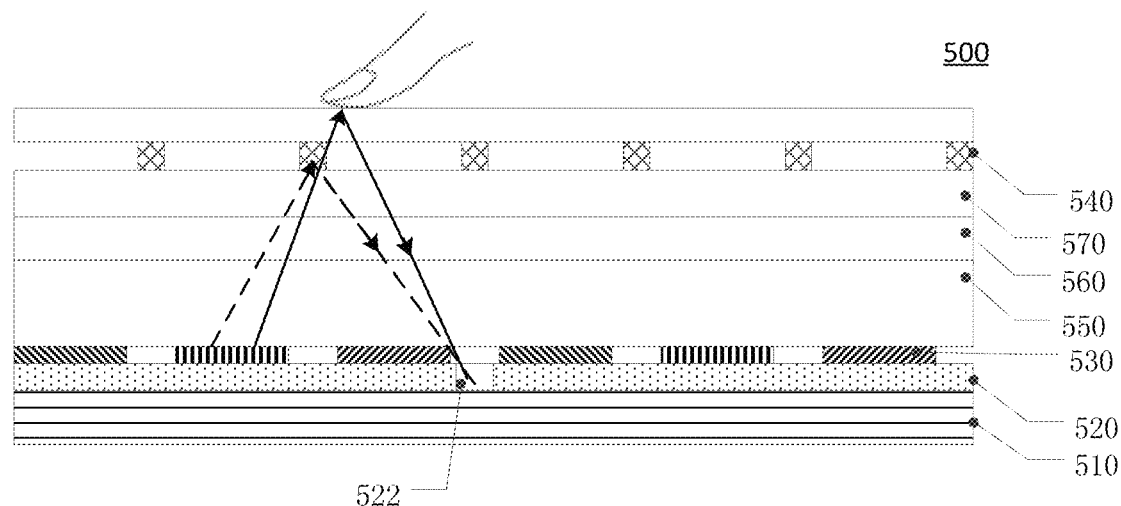
FIG. 1A is a schematic cross-sectional view of a display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Organic light-emitting diode display panels are increasingly used in the display field due to their characteristics of self-illumination, fast response, wide viewing angle, being able to be formed on flexible substrates and the like. For example, a flexible organic light-emitting diode display panel can also be applied to various flexible special-shaped products. Fingerprint recognition devices have been widely used in portable electronic devices such as mobile phones and tablet computers. At present, the fingerprint recognition device is separately disposed outside a display screen, that is, an outside-screen fingerprint recognition mode is adopted, which results in a wider frame of the fingerprint recognition device such as the mobile phone. In this regard, it may be considered to combine the fingerprint recognition device with the display screen of a display panel to implement the under-screen fingerprint recognition, thereby realizing the narrow frame design of the display panel. In addition, the combination of display and touch functions is also a development direction of current electronic devices. For example, a fingerprint recognition device including a fingerprint detection circuit as well as an organic light-emitting diode display panel that has a touch function can be prepared, and the detection circuit can be disposed, for example, below the organic light-emitting diode display panel.

Figure 1B:
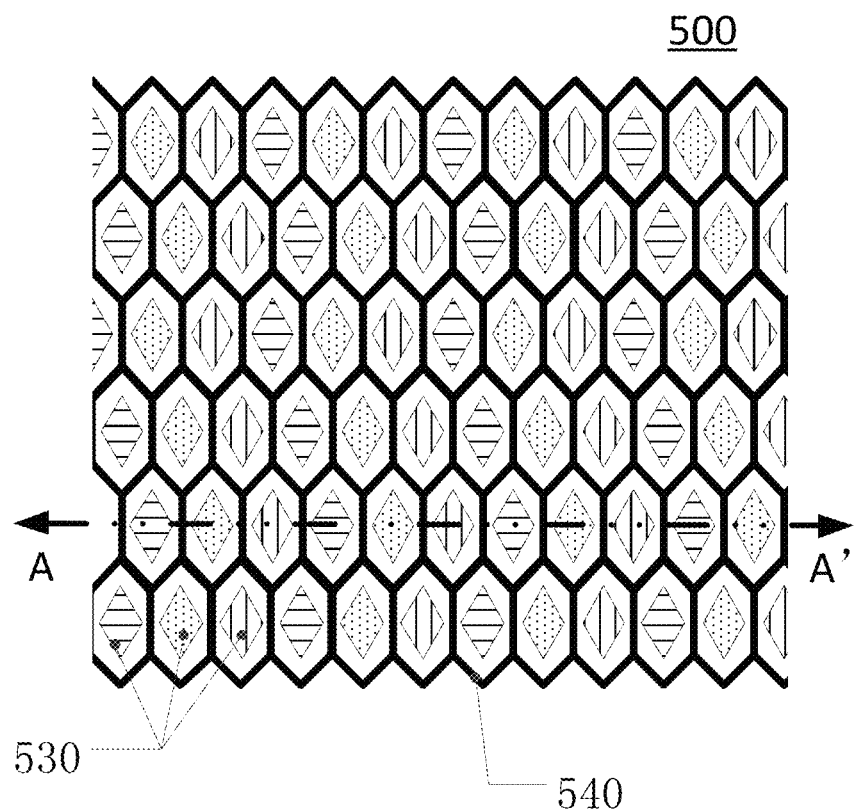
FIG. 1B is a schematic plan view of the display panel illustrated in FIG. 1A.

FIG. 1A and FIG. 1B are a schematic cross-sectional view and a plan view of a display panel 500, and the cross-sectional view shown in FIG. 1A is taken along line A-A' shown in FIG. 1B. For example, as shown in FIG. 1A, the display panel 500 can include an imaging layer 510, a pinhole light-shielding layer 520, a display array layer 530, an encapsulation layer 550, an optical adhesive 560, a base material 570, a touch layer 540, a cover plate and the like. For example, the optical adhesive 560 may be an OCA (optically clear adhesive) optical adhesive, and the base material 570 may be a cyclo-olefin polymer (COP) film or a polyethylene terephthalate (PET) film or a colorless polyimide (CPI) film, and embodiments of the present disclosure are not limited thereto. For example, the pinhole light-shielding layer 520 can include at least one hole-shaped light-transmitting region 522.

The inventors of the present disclosure have noted that, as shown in FIG. 1A, when the display panel 500 performs an imaging function (e.g., fingerprint imaging), the imaging layer 510 can not only receive light (e.g., as illustrated by a solid line with an arrow in FIG. 1A) reflected by an object to be imaged (e.g., a finger), but can also receive light (e.g., as illustrated by a dashed line with an arrow in FIG. 1A)

reflected by the touch layer 540, thereby reducing imaging quality of the imaging layer 510 and the display panel 500. Further, the inventors of the present disclosure have also noted that the optical adhesive 560 and the base material 570 increase the thickness of the display panel 500 and may lower the brightness of the display panel 500.

Embodiments of the present disclosure provide a display panel and a display device, and the display panel and the display device can improve imaging quality.

At least one embodiment of the present disclosure provides a display panel. The display panel includes an imaging layer, a pinhole light-shielding layer, a display array layer and a touch layer. The imaging layer, the display array layer and the touch layer are sequentially disposed; the pinhole light-shielding layer is disposed between the imaging layer and the touch layer and includes a light-shielding region and at least one hole-shaped light-transmitting region that is corresponding to the imaging layer; light of the display array layer is emitted from a side away from the imaging layer; and the touch layer includes touch mesh patterns formed by conductive wires, at least one touch mesh pattern includes a first mesh corresponding to the hole-shaped light-transmitting region and includes second meshes outside the first mesh, and a size of the first mesh is larger than sizes of the second meshes.

In the display panel provided in the embodiment, by providing the touch mesh pattern that includes the first mesh corresponding to the hole-shaped light-transmitting region and includes the second meshes, and by making the size of the first mesh larger than the sizes of the second meshes, the light that is reflected by the touch mesh patterns and is incident on the imaging layer can be reduced, and thus the imaging quality of the imaging layer and the display panel can be improved.

Unrestricted description will be given to the display panel provided by the embodiments of the present disclosure below by way of a few examples. As described below, different features in these specific examples may be combined with each other in case of no confliction, thereby obtaining new examples, and these new examples are also within the scope of the disclosure.

Figure 2A:
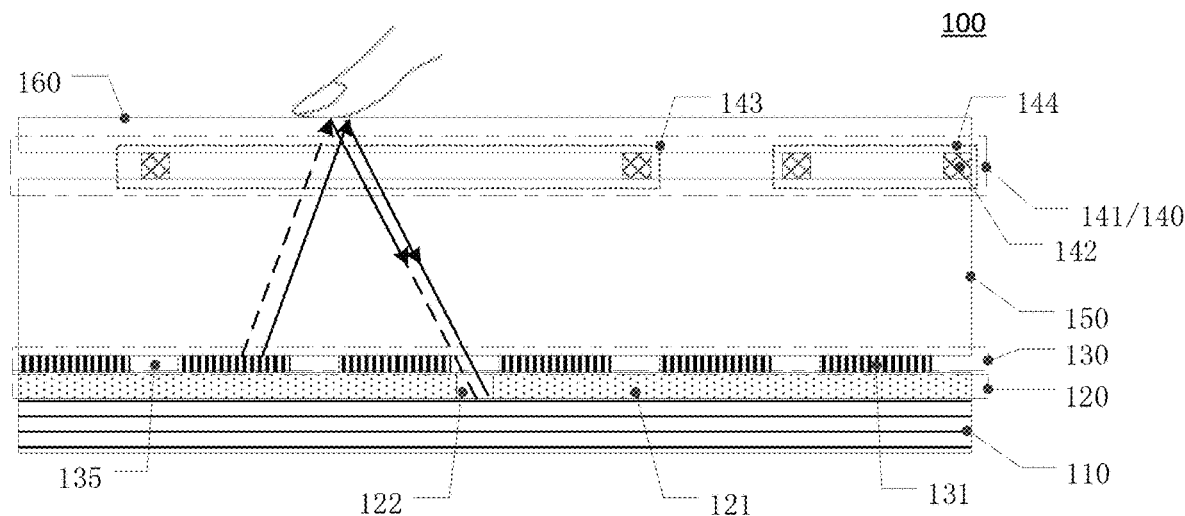
FIG. 2A is a schematic cross-sectional view of a display panel according to an embodiment of the present disclosure.
Figure 2B:
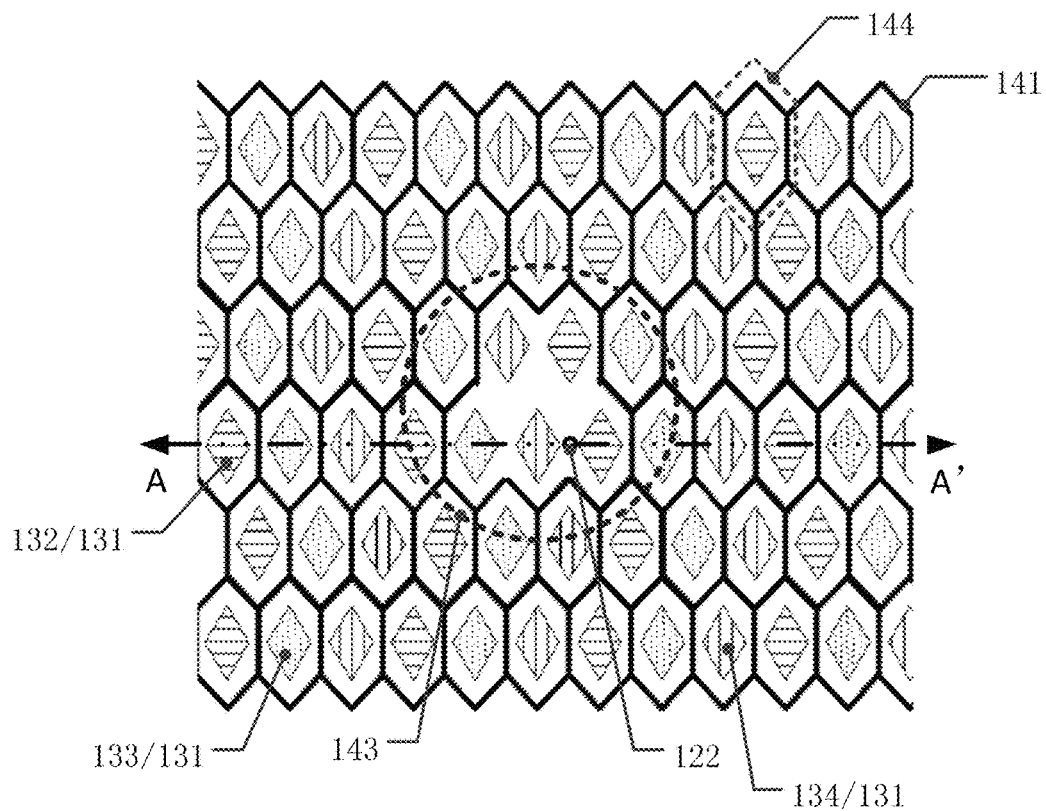
FIG. 2B is a schematic plan view of touch mesh patterns and display pixels according to an embodiment of the present disclosure.

For example, FIG. 2A and FIG. 2B are a schematic cross-sectional view and a plan view of a display panel 100 according to at least one embodiment of the present disclosure, and the schematic cross-sectional view illustrated in FIG. 2A is obtained taken along line AA' of FIG. 2B. It should be noted that, for the sake of clarity, FIG. 2B shows only partial regions of partial layers included in the display panel 100.

For example, as shown in FIG. 2A, the display panel 100 can include an imaging layer 110, a pinhole light-shielding layer 120, a display array layer 130 and a touch layer 140, and a display panel can realize a under-screen fingerprint recognition function. For example, as shown in FIG. 2A, the imaging layer 110, the display array layer 130 and the touch layer 140 are sequentially disposed, and the pinhole light-shielding layer 120 is disposed between the imaging layer 110 and the touch layer 140. For example, as shown in FIG. 2A, the pinhole light-shielding layer 120 may be disposed between the imaging layer 110 and the display array layer 130; or, for example, in a situation where the imaging function of the display panel 100 is realized by only a partial region of the display panel 100 (for example, as shown in 2D, the partial region is an imaging region 180 located in a peripheral region of the display panel 100), the pinhole light-shielding layer 120 may be disposed between the display array layer 130 and the touch layer 140. For the sake of clarity, detailed description will be given to the embodiments of the present disclosure in the following by taking the example that the pinhole light-shielding layer 120 is disposed between the imaging layer 110 and the display array layer 130, and the embodiments of the present disclosure are not limited thereto.

For example, as shown in FIGS. 2A and 2B, the display array layer 130 may include a plurality of display pixels 131. For example, the display pixels 131 have a certain transmittance for light reflected from a display side (that is, the display pixels 131 do not block all the light reflected from the display side), and thus the light reflected from the display side (for example, light reflected by a fingerprint of a finger) can pass through the display array layer 130 and the hole-shaped light-transmitting region 122 of the pinhole light-shielding layer 120 and then be incident onto the imaging layer 110. For example, because the touch layer 140 is disposed at the display side of the display panel, the touch layer 140 can reflect light emitted from the display pixel 131, a part of the light reflected by the touch layer 140 can pass through the display array layer 130 and the hole-shaped light-transmitting region 122 of the pinhole light-shielding layer 120 and then be incident on the imaging layer 110, the light that is reflected is in a stray state, thus the imaging quality of the imaging layer 110 may be degraded, and for fingerprint recognition, the success rate of fingerprint recognition is reduced. It should be noted that the "display side" herein refers to a side of the display pixels 131 and the side of the display pixels is away from the imaging layer 110.

For example, as shown in FIG. 2B, a shape of each display pixel 131 may be a diamond shape, and the embodiments of the present disclosure are not limited thereto; the shape of the plurality of display pixels 131 may also be at least one of a rectangle, a triangle, and a hexagon according to actual application requirements. For example, as shown in FIG. 2B, the plurality of display pixels 131 may include first display pixels 132, second display pixels 133 and third display pixels 134, and light emitted from the first display pixels 132, light emitted from the second display pixels 133 and light emitted from the third display pixels 134 may be, for example, red light, green light and blue light, respectively; and embodiments of the present disclosure are not limited thereto, and for example, the display array layer 130 may further include display pixels that emit white light.

Figure 2C:
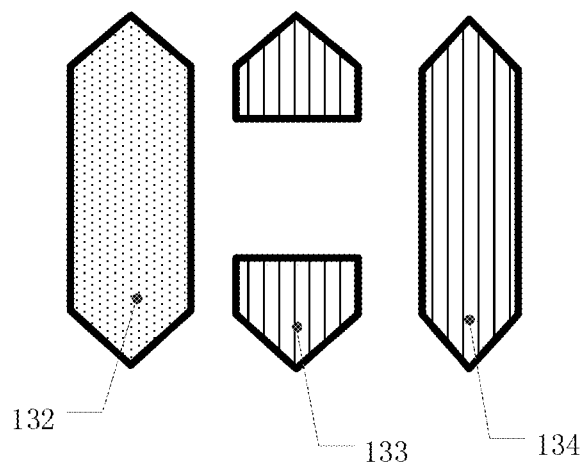
FIG. 2C is a schematic view of a display pixel arrangement manner according to an embodiment of the present disclosure.

For example, as shown in FIG. 2B, in a case where the plurality of display pixels 131 include the first display pixel 132, the second display pixel 133 and the third display pixel 134, the plurality of display pixels 131 (i.e., the first display pixel 132, the second display pixel 133 and the third display pixel 134) may be arranged in a Δ arrangement mode. The embodiments of the present disclosure are not limited thereto; for example, the plurality of display pixels 131 may also be arranged in a rectangle (not shown). For another example, the plurality of display pixels 131 may also be arranged in a pattern as shown in FIG. 2C.

For example, each of the display pixels 131 may include a self-luminous element, which may be, for example, a light-emitting diode. The light-emitting diode may be, for example, an organic light-emitting diode (OLED) or an inorganic light-emitting diode, which is not specifically limited in the embodiments of the present disclosure. For example, as shown in FIG. 2A, the light-emitting diode may emit light toward the display side (that is, the light of the display array layer 130 is emitted from faces the side away from the imaging layer 110).

Figure 2D:
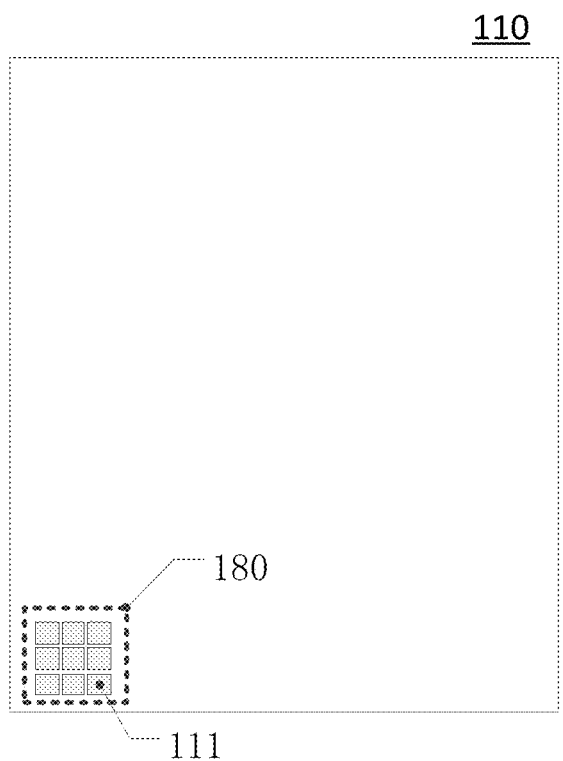
FIG. 2D is a schematic plan view of an imaging layer according to an embodiment of the present disclosure.

For example, the imaging layer 110 can include at least one imaging pixel 111 (e.g., the at least one imaging pixel 111 can include a plurality of imaging pixels 111 arranged in an array). For example, as shown in FIG. 2D, the display panel 100 may include the imaging region 180 (that is, a region that is included by the display panel 100 and has an imaging function), all of the imaging pixels 111 may be disposed in the imaging region 180 of the display panel 100, the imaging region 180 may be provided, for example, in a display region of the display panel 100 (for example, a lower left corner of the display panel 100), and embodiments of the present disclosure are not limited thereto. It should be noted that the display panel 100 provided by the embodiments of the present disclosure is not limited to having only one imaging region, and the display panel 100 may have a plurality of discrete imaging regions according to actual application requirements.

Figure 2E:
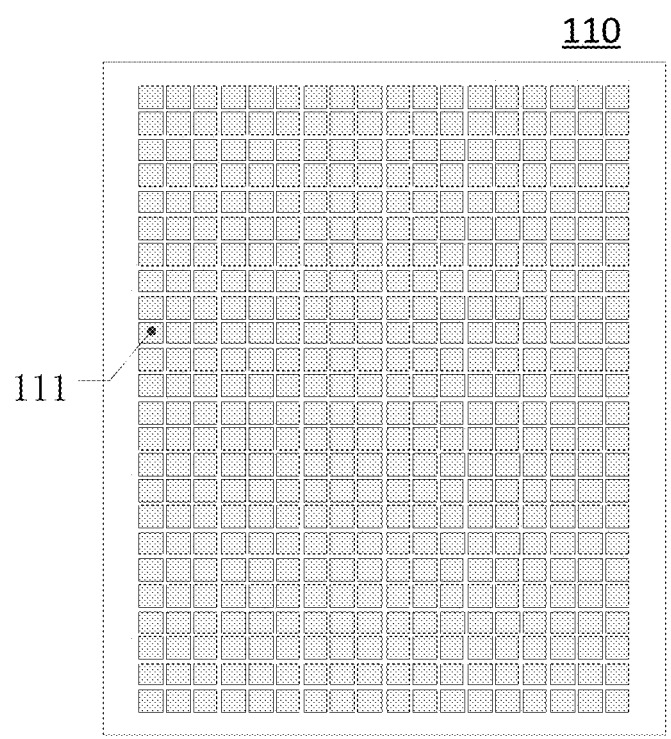
FIG. 2E is another schematic plan view of the imaging layer according to an embodiment of the present disclosure.

For another example, as shown in FIG. 2E, the display panel 100 may further have a full-screen imaging function (for example, all the region of the display panel 100, except for the peripheral region, has an imaging function), and in this case, the plurality of imaging pixels 111 may also be arranged uniformly in the entire display panel 100 (for example, in the region of the display panel 100 except for the peripheral region), and therefore, light from an object to be imaged can be incident to the imaging layer 110 via any position of the display panel 100, whereby the full-screen imaging function (for example, a full-screen fingerprint recognition function) can be realized. It should be noted that the numbers of the imaging pixels 111 illustrated in FIG. 2D and FIG. 2E are only examples, and embodiments of the present disclosure are not limited thereto.

For example, the imaging pixel 111 may be of a suitable type, for example, may include a photodiode and a switching transistor, the photodiode may convert an optical signal incident thereto into an electrical signal, and the switching transistor may be electrically connected with the photodiode to control whether the photodiode is in a state of acquiring the optical signal and to control a duration of acquiring the optical signal. For example, the type and arrangement of the photodiode can be set according to actual application requirements, and the embodiments of the present disclosure are not specifically limited thereto. For example, the photodiode can be a PIN junction photodiode or a phototransistor or the like, thereby increasing the response speed of the photodiode.

For example, as shown in FIG. 2A, the pinhole light-shielding layer 120 may include the light-shielding regions 121 and at least one hole-shaped light-transmitting region 122 that is corresponding to the imaging pixel 111. For example, as shown in FIGS. 2A and 2B, an orthographic projection of the hole-shaped light-transmitting region 122 on the display array layer 130 may be between adjacent display pixels 131; for example, in the case where an opening 135 is between adjacent display pixels 131, and the display pixels 131 can block visible light, the orthographic projection of the hole-shaped light-transmitting region 122 on the display array layer 130 can be located in the opening 135 between the adjacent display pixels 131, thereby preventing the light emitted from the display pixels 131 from being directly incident on the imaging layer 110 via the hole-shaped light-transmitting region 122; for example, in a case where the display pixel 131 is of a top emission type, the orthographic projection of the hole-shaped light-transmitting region 122 on the display array layer 130 may be larger than the opening between the adjacent display pixels 131. For example, as shown in FIG. 2A, the orthographic projection of the hole-shaped light-transmitting region 122 on the display array layer 130 can be located within an orthographic projection of the imaging layer 110, thereby allowing the imaging layer 110 to better receive the light from the object to be imaged (for example, a finger).

Figure 3A:
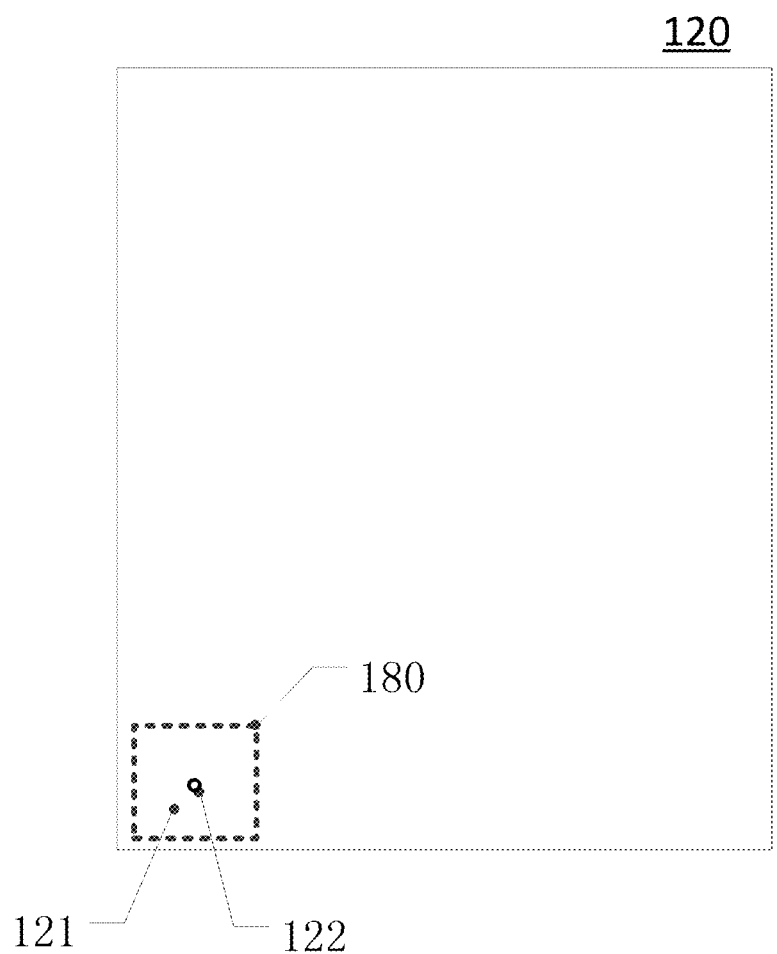
FIG. 3A is a schematic plan view of a pinhole light-shielding layer according to an embodiment of the present disclosure.
Figure 3B:
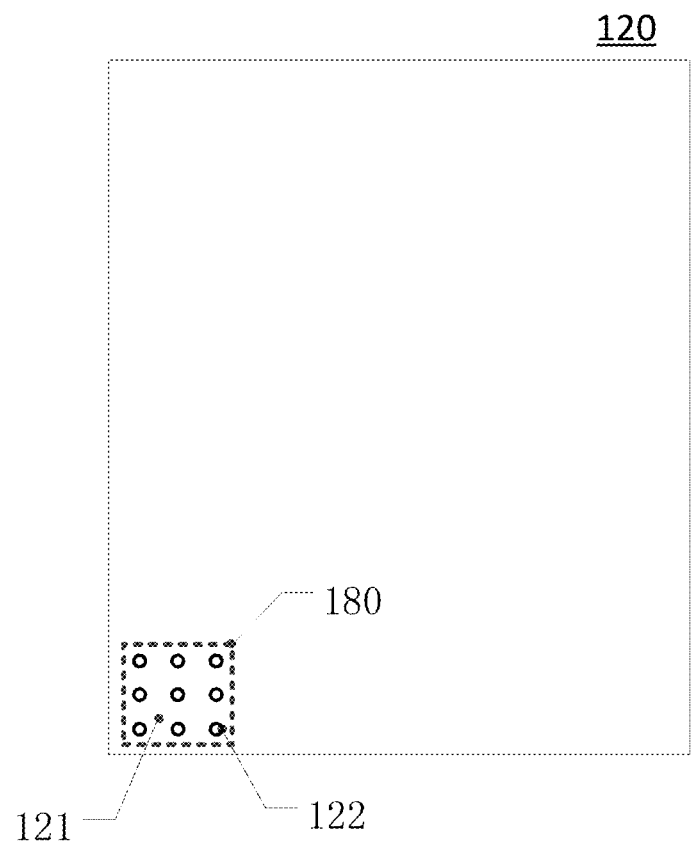
FIG. 3B is another schematic plan view of the pinhole light-shielding layer according to an embodiment of the present disclosure.

For example, in the case where all of the imaging pixels 111 are disposed in the imaging region 180 of the display panel 100 (see FIG. 2D), the at least one hole-shaped light-transmitting region 122 is also disposed in the imaging region 180 of the display panel 100 (see FIG. 3A and FIG. 3B), and in this case, the pinhole light-shielding layer 120 may include one hole-shaped light-transmitting region 122 (see FIG. 3A), or may include a plurality of hole-shaped light-transmitting regions 122 arranged in an array (see FIG. 3B). For another example, as shown in FIG. 2E, in the case where the plurality of imaging pixels 111 are uniformly arranged in the entire display panel 100, the pinhole light-shielding layer 120 may include a plurality of hole-shaped light-transmitting regions 122 uniformly arranged in the entire display panel 100 (see FIG. 3C). For example, for the sake of clarity, the embodiments of the present disclosure will be specifically described below taking the example that the pinhole light-shielding layer 120 has only one hole-shaped light-transmitting region 122, and embodiments of the present disclosure are not limited thereto.

Figure 3C:
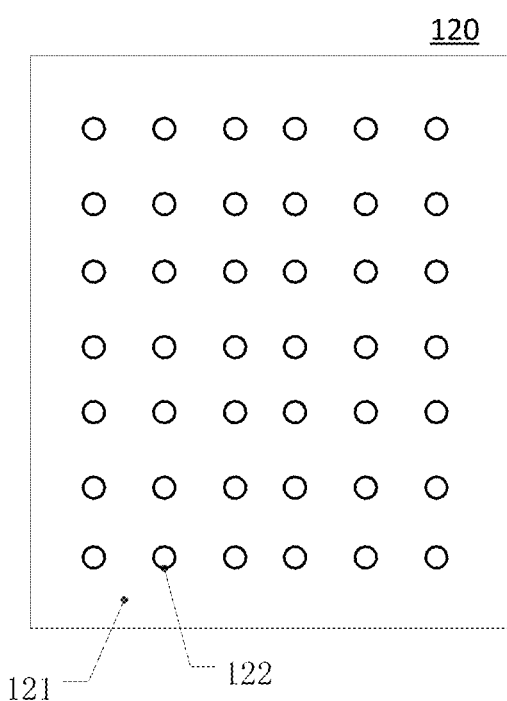
FIG. 3C is still another schematic plan view of the pinhole light-shielding layer according to an embodiment of the present disclosure.

For example, the shape and size of the hole-shaped light-transmitting region 122 can be set according to actual application requirements, and the embodiments of the present disclosure are not specifically limited thereto. For example, the shape of the hole-shaped light-transmitting region 122 may be circular or square, and a diameter of the hole-shaped light-transmitting region 122 may be from 1 micron to 12 microns (e.g., from 3 microns to 8 microns), and embodiments of the present disclosure are not limited thereto. It should be noted that the numbers of the hole-shaped light-transmitting regions 122 illustrated in FIGS. 3B and 3C are only exemplary, and embodiments of the present disclosure are not limited thereto.

For example, the touch layer 140 may include touch mesh patterns 141 formed of conductive wires. For example, the conductive wires may be formed of an electrically conductive material such as metal, metal oxide, or graphene. For the sake of clarity, the embodiments of the present disclosure will be described in detail below by taking the touch layer 140 including the touch mesh patterns 141 formed by metal wires 142 as an example, and the embodiments of the present disclosure are not limited thereto.

For example, as shown in FIGS. 2A and 2B, the touch layer 140 includes touch mesh patterns 141 formed of the metal wires 142. For example, orthographic projections of the metal wires 142 on the display array layer 130 are between adjacent display pixels 131 respectively, that is, the orthographic projections of the metal wires 142 on the display array layer 130 do not overlap with (i.e., are spaced apart from) the adjacent display pixels 131. For example, in the case where the orthographic projections of the metal wires 142 on the display array layer 130 is between adjacent display pixels 131, the widths of the metal wires 142 (i.e., the widths in a direction that is perpendicular to an extending direction of the metal wires 142 and is parallel to a panel face of the display panel) may be reduced, whereby the intensity of the light reflected by the metal wires 142 can be reduced, and thus the imaging quality of the imaging layer 110 can be improved. For example, the widths of the metal wires 142 (i.e., the widths in the direction perpendicular to the extending direction of the metal wires 142) may be from 1 micron to 6 microns (e.g., from 3 microns to 4 microns), and embodiments of the present disclosure are not limited thereto.

For example, as shown in FIG. 2B, the touch mesh patterns 141 include the first mesh 143 (see the partially enlarged view in FIG. 4A) that is corresponding to the hole-shaped light-transmitting region 122 and include the second meshes (see a partially enlarged view in FIG. 4E) outside the first mesh 143. For example, as shown in FIG. 2B, the density of the first mesh 143 can be smaller than the density of the second meshes 144. It should be noted that the density of the mesh (the first mesh 143 or the second mesh 144) refers to the number of the meshes provided in a unit area.

Figure 4A:
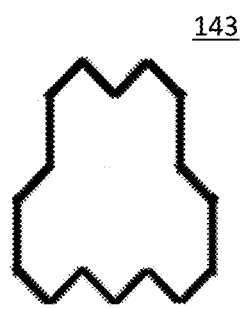
FIG. 4A is a schematic plan view of a first mesh according to an embodiment of the present disclosure.
Figure 4B:
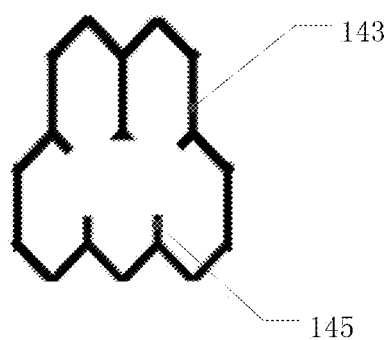
FIG. 4B is a schematic plan view of the first mesh and an auxiliary mesh wire according to an embodiment of the present disclosure.

For example, as shown in FIG. 2B, an orthographic projection of each second mesh 144 on the display array layer 130 can surround at least one display pixel 131 correspondingly. For example, as shown in FIG. 2B and FIG. 4E, a shape of the second mesh 144 may be a hexagon, and the embodiments of the present disclosure are not limited thereto; for another example, the shape of the second mesh 144 may also be other polygon such as a pentagon or a quadrangle; for example, the second mesh 144 may have other shapes (for example, the quadrangle) based on the arrangement of the display pixels 131 and the touch requirements.

For example, the second meshes 144 may be directly formed at a side of the display array layer 130 away from the imaging layer 110 by a mask process, and the embodiments of the present disclosure are not limited thereto; for another example, the second meshes 144 may be firstly formed by other processes, and then the formed second meshes 144 are transferred to the side of the display array layer 130 away from the imaging layer 110.

Figure 4D:
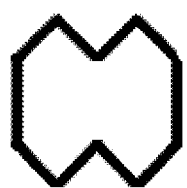
FIG. 4D is another schematic plan view of the first mesh according to an embodiment of the present disclosure.
Figure 5A:
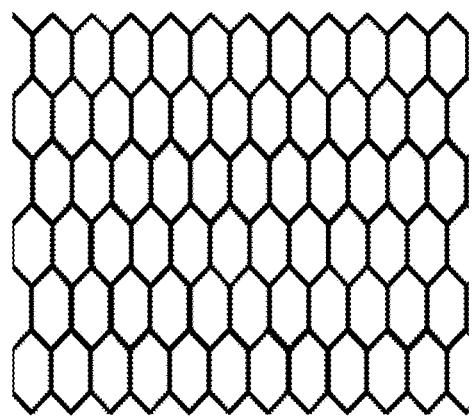
FIG. 5A illustrates second meshes arranged in an array.
Figure 5B:
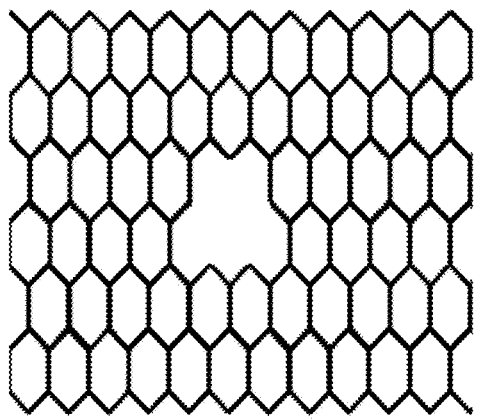
FIG. 5B illustrates the touch mesh patterns according to an embodiment of the present disclosure.

For example, the first mesh 143 may be formed during a patterning process of forming the second meshes 144, that is, the first mesh 143 and the second meshes 144 may be formed in the same patterning process, in this case, a mask plate for forming the touch mesh patterns 141 has both a mask pattern corresponding to the first mesh 143 and a mask pattern corresponding to the second meshes 144. For another example, it is also possible to firstly form the second meshes 144 arranged in an array (see FIG. 5A), and then form the first mesh 143 by partially removing the metal wires 142 of the formed second meshes 144 corresponding to a position where the first mesh 143 is to be located, that is, as shown in FIGS. 4A and 4B, a shape of the first mesh 143 may be a shape of an outer contour of a mesh structure formed by a plurality of closely arranged second meshes 144. It should be noted that the shapes of the first mesh 143 shown in FIG. 4A and FIG. 4B are only exemplary, and the first mesh 143 may have other shapes (for example, the shape shown in FIG. 4D) according to actual needs.

For example, as shown in FIGS. 2B, 4A and 4B, the size of the first mesh 143 is larger than the size of the second mesh 144. It should be noted that the size of the mesh (the first mesh 143 or the second mesh 144) refers to a minimum radius of a circle that can surround the mesh. Therefore, for the unit area, an area of the metal wires 142 of the first mesh 143 is smaller than an area of the metal wires 142 of the second meshes 144; correspondingly, an intensity of the light that is emitted by the display pixels 131 and reflected by the first mesh 143 is smaller than an intensity of the light that is emitted by the display pixels 131 and reflected by the second meshes 144.

For example, as shown in FIG. 2B, the orthographic projection of the hole-shaped light-transmitting region 122 on the display array layer 130 can be within an orthographic projection of the first mesh 143 on the display array layer 130. Because the intensity of the light emitted by the display pixels 131 and reflected by the first mesh 143 is smaller than the intensity of the light emitted by the display pixels 131 and reflected by the second meshes 144; compared with the touch mesh pattern shown in FIG. 1A, the touch mesh patterns 141 shown in FIG. 2B can reduce the reflected light that passes through the hole-shaped light-transmitting region 122 and then is incident on the imaging layer 110 (the light reflected by the touch mesh patterns 141), thereby improving the imaging quality of the imaging layer 110 of the display panel 100 provided by the embodiments of the present disclosure.

For example, according to the actual application requirements, a center of the orthographic projection of the hole-shaped light-transmitting region 122 on the display array layer 130 may be located at a symmetry axis of the orthographic projection of the first mesh 143 on the display array layer 130. For another example, according to actual application requirements, the center of the orthographic projection of the hole-shaped light-transmitting region 122 on the display array layer 130 substantially coincides with a center of the orthographic projection of the first mesh 143 on the display array layer 130 (i.e., the orthographic projection of a center of the circle surrounding the first mesh 143 on the display array layer 130), so that the reflected light that passes through the hole-shaped light-transmitting region 122 and then is incident on the imaging layer 110 (the light reflected by the touch mesh patterns 141) can be further reduced, whereby the imaging quality of the imaging layer 110 of the display panel 100 provided by the embodiments of the present disclosure can be further improved.

For example, the size of the first mesh 143 may be set based on the specific structure of the display panel 100 and the actual application requirements, which is not specifically limited in the embodiments of the present disclosure. For example, a method of setting the size of the first mesh 143 will be exemplarily described below with reference to FIG. 6.

Figure 6:
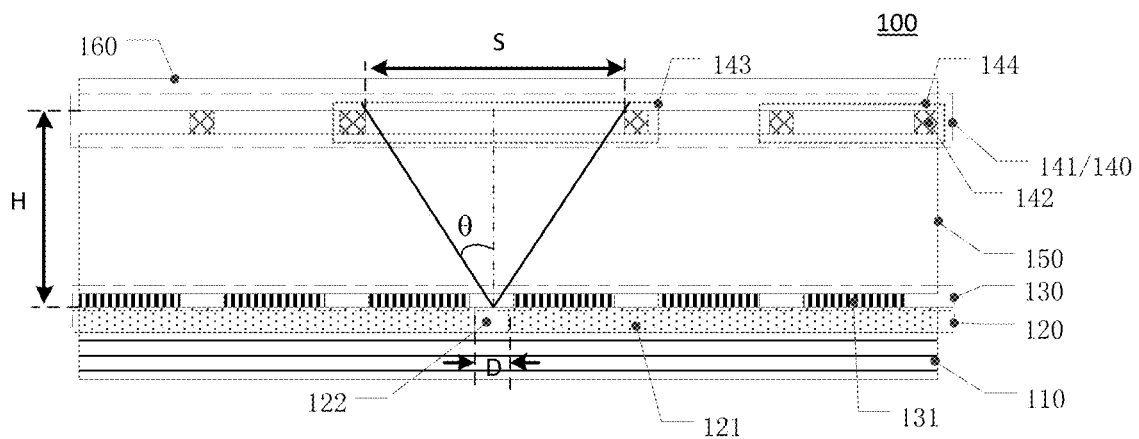
FIG. 6 is a schematic principle diagram for determining a size of the first mesh.

For example, as shown in FIG. 6, the size S of the first mesh 143 may satisfy the following relationship, that is, $S=2H \times \tan\theta + D$, where H is a distance between the touch layer 140 (for example, a surface of the touch layer 140 at a side away from the imaging layer 110) and the pinhole light-shielding layer 120 (for example, a surface of the pinhole light-shielding layer 120 at a side away from the imaging layer 110); D is a diameter of the hole-shaped light-transmitting region 122; 0 is half of a divergence angle of the light emitted from the display pixels 131. For example, 0 may be 0-85 degrees; H may be 1-15 microns; the size S of the first mesh 143 may be 10-100 microns (e.g., 20-40 microns), and embodiments of the present disclosure are not limited thereto.

Figure 4C:
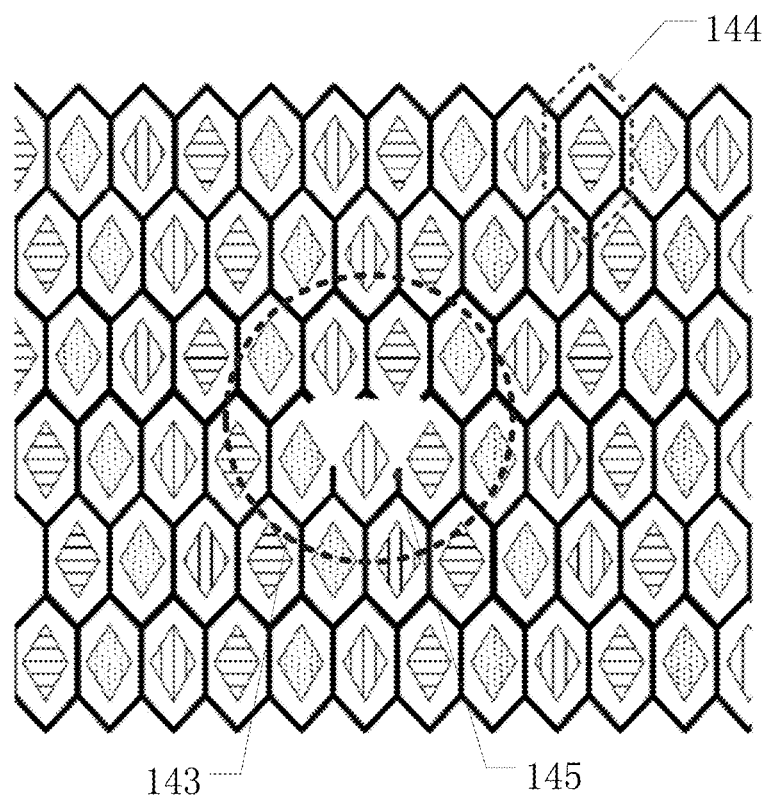
FIG. 4C is another schematic plan view of the touch mesh pattern and the display pixels according to an embodiment of the present disclosure.
Figure 4E:
FIG. 4E is a schematic plan view of a second mesh according to an embodiment of the present disclosure.

For example, as shown in FIG. 4B and FIG. 4C, the touch mesh patterns 141 may further include auxiliary mesh wires 145 disposed within the first mesh 143, first ends of the auxiliary mesh wires 145 may be connected with the metal wires 142 that form the first mesh 143, and second ends of the auxiliary mesh wires 145 can be suspended. For example, compared with the touch mesh patterns 141 shown in FIG. 2B, the touch mesh patterns 141 shown in FIG. 4C can reflect ambient light relatively uniformly, thereby improving the uniformity of the light that is reflected by the touch mesh patterns 141 and is observed by a user, in this way, the image display quality of the display panel 100 can be ensured while improving the imaging quality of the display panel 100.

Figure 7A:
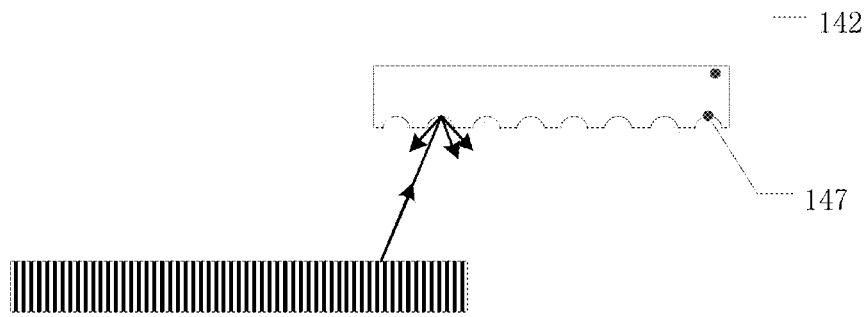
FIG. 7A is a schematic cross-sectional view of scattering points according to an embodiment of the present disclosure.
Figure 7B:
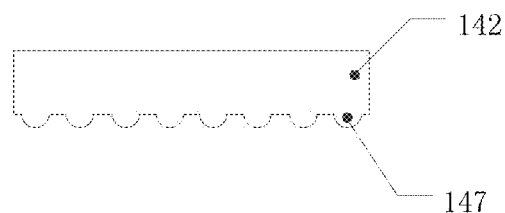
FIG. 7B is another schematic cross-sectional view of the scattering points according to an embodiment of the present disclosure.

For example, the surface of the metal wire 142 that is at a side of the metal wire 142 closer to the imaging layer 110 may be a plane, and the plane may be parallel to the imaging layer 110. For another example, according to actual application requirements, the surface of the metal wire 142 that is at the side closer to the imaging layer 110 may further include a plurality of scattering points 147, and the scattering points 147 protrude from (see FIG. 7B) or dent into (see FIG. 7A) the surface at the side closer to the imaging layer 110. For example, as shown in FIG. 7A, the scattering points 147 may scatter light incident thereon, that is, the scattering points 147 can make the light that is incident thereon from any direction transmit in a plurality of directions, so that the reflected light incident on the imaging layer 110 can be further reduced, thereby the imaging quality of the imaging layer 110 of the display panel 100 provided by the embodiments of the present disclosure can be further improved. For example, a shape of the scattering points 147 may be hemispherical, and the scattering points 147 may have a size of 5 nm to 70 nm, and embodiments of the present disclosure are not limited thereto.

Figure 8:
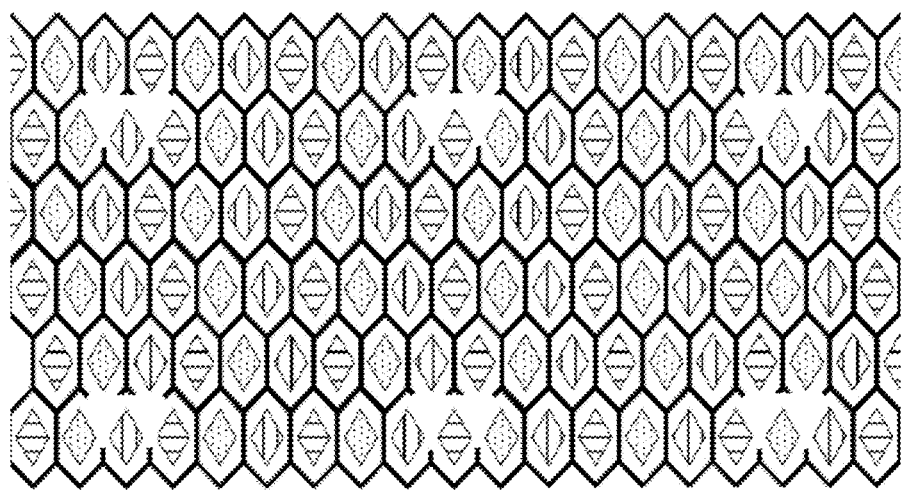
FIG. 8 is still another schematic plan view of the touch mesh pattern and the display pixels according to an embodiment of the present disclosure.

For example, in the case where the pinhole light-shielding layer 120 has a plurality of hole-shaped light-transmitting regions 122, as shown in FIG. 8, the touch mesh patterns 141 may include a plurality of first meshes 143, and it should be noted that the number of the hole-shaped light-transmitting regions 122 included in the pinhole light-shielding layer 120 shown in FIG. 8 is exemplary, and the embodiments of the present disclosure are not limited thereto. For example, the plurality of first meshes 143 may correspond to the plurality of hole-shaped light-transmitting regions 122 in a one-to-one correspondence manner, and embodiments of the present disclosure are not limited thereto.

The touch layer 140 can be of a capacitive touch structure, and the capacitive touch structure may be a surface capacitive touch structure or a projected capacitive touch structure. In the case where the touch layer 140 is implemented as the projected capacitive touch structure, the touch layer 140 can be implemented as a self-capacitance touch structure or a mutual capacitance touch structure. The self-capacitance touch structure includes, for example, a plurality of self-capacitance electrodes disposed in a same layer, each self-capacitance electrode is electrically connected with a corresponding leading wire, and the leading wire is connected with a touch processing circuit; the mutual-capacitance touch structure includes, for example, a plurality of driving electrodes and a plurality of sensing electrodes (the driving electrodes and the sensing electrodes are arranged in a same layer or different layers) are intersected with each other, a touch processing circuit is electrically connected with the driving electrodes to apply driving signals to the driving electrodes, and the touch processing circuit is electrically connected with the sensing electrodes to receive sensing signals outputted by the sensing electrodes.

Figure 9A:
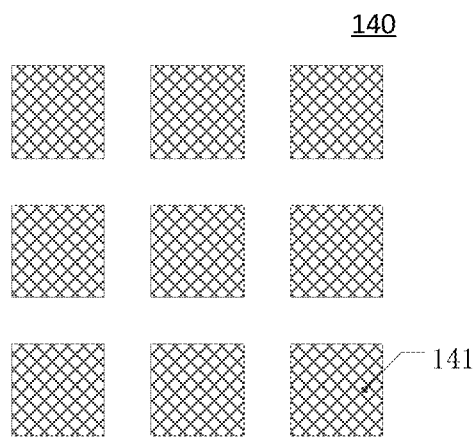
FIG. 9A is a schematic plan view of a touch layer according to an embodiment of the present disclosure.
Figure 9B:
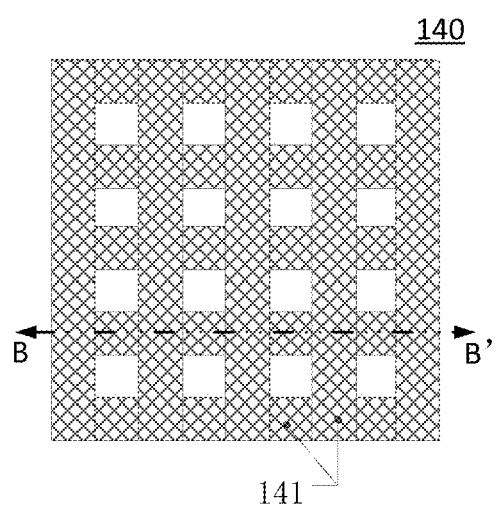
FIG. 9B is another schematic plan view of the touch layer according to an embodiment of the present disclosure.
Figure 9C:
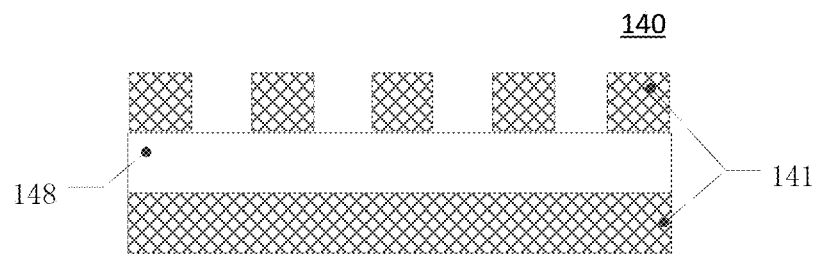
FIG. 9C is a schematic cross-sectional view of the touch layer illustrated in FIG. 9B.

The specific structure of the touch layer 140 will be exemplarily described below with reference to FIGS. 9A-9C. For example, as shown in FIG. 9A, the touch layer 140 may include a plurality of the touch mesh patterns 141 which are arranged in an array and in a same layer. For example, as shown in FIG. 9B and FIG. 9C, the touch layer 140 may further include a plurality of touch mesh patterns 141 disposed in different layers, and the touch mesh patterns 141 disposed in different layers may be separated by an insulating layer 148. It should be noted that the cross-sectional view of the touch layer 140 shown in FIG. 9C is taken along the line B-B' shown in FIG. 9B.

For example, the first mesh 143 may be disposed only at the portion of the touch mesh patterns 141 corresponding to both the imaging pixels 111 and the hole-shaped light-transmitting region 122, and other portions of the touch mesh patterns 141 may be provided with only the second meshes 144. For example, the first mesh 143 may be disposed only at the position of the touch mesh patterns 141 located at the lower left corner in FIG. 9A, and embodiments of the present disclosure are not limited thereto.

Figure 10A:
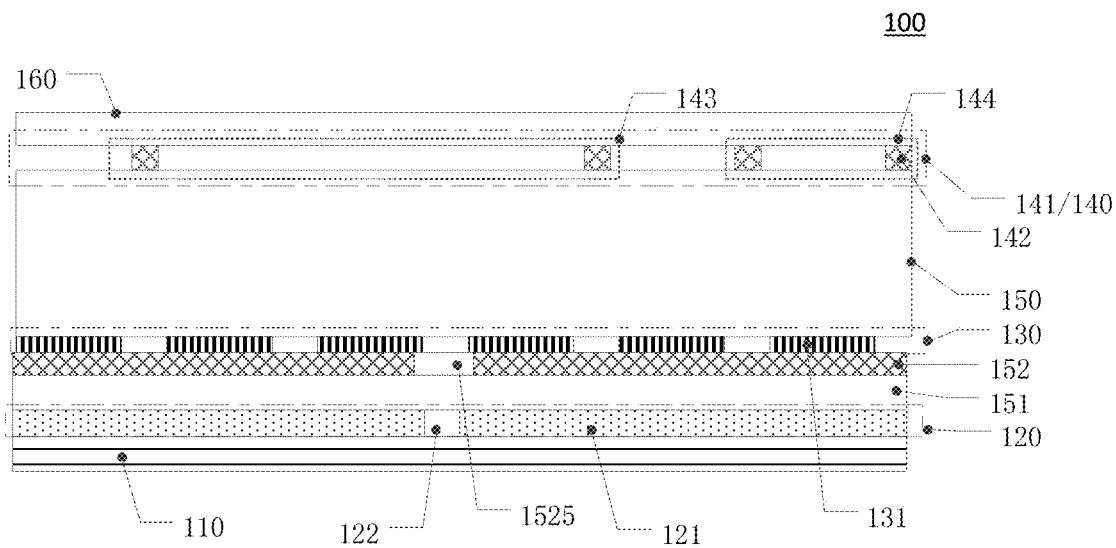
FIG. 10A is another schematic cross-sectional view of the display panel according to an embodiment of the present disclosure.
Figure 10B:
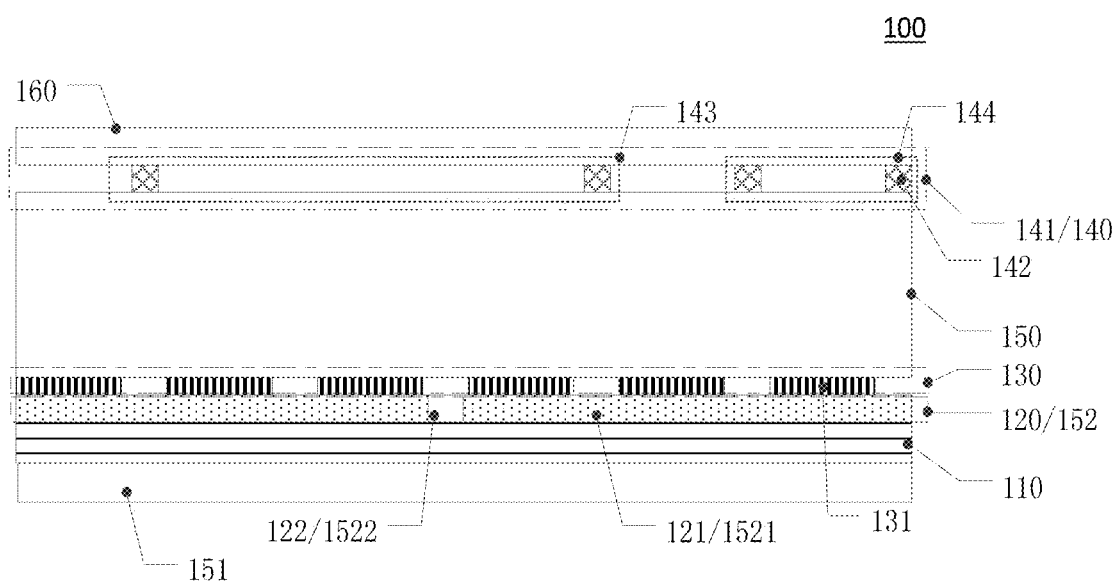
FIG. 10B is still another schematic cross-sectional view of the display panel according to an embodiment of the present disclosure.
Figures 10C, 11:
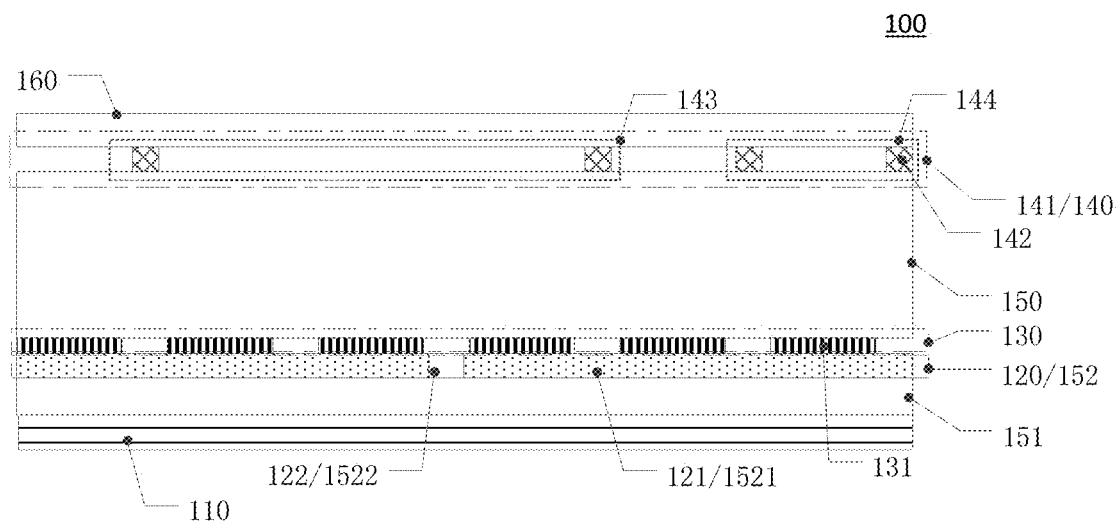
FIG. 10C is still another cross-sectional view of the display panel according to an embodiment of the present disclosure.
FIG. 11 is an exemplary block diagram of a display device according to an embodiment of the present disclosure.

For example, according to actual application requirements, as shown in FIGS. 10A, 10B and 10C, the display panel 100 may further include a base substrate 151 and a drive circuit layer 152. For example, the drive circuit layer 152 is electrically connected with the display pixels 131 and is configured to drive the display pixels 131 to emit light. For example, the drive circuit layer 152 is disposed between the display array layer 130 and the imaging layer 110, and the imaging layer 110 is disposed on any side of the base substrate 151. For example, the specific arrangement positions of the base substrate 151 and the drive circuit layer 152 are exemplarily explained below with reference to FIGS. 10A, 10B and 10C, and the embodiments of the present disclosure are not limited thereto.

For example, as shown in FIG. 10A, the drive circuit layer 152 and the base substrate 151 may be disposed between the display array layer 130 and the pinhole light-shielding layer 120, and in this case, the pinhole light-shielding layer 120 and the drive circuit layer 152 are two separate layers. In this case, the drive circuit layer 152 may include an opening 152S, whereby the light reflected by the object to be imaged may pass through the opening 152S of the drive circuit layer 152 and the hole-shaped light-transmitting region 122 of the pinhole light-shielding layer 120 and then be incident on the imaging layer 110.

For another example, as shown in FIG. 10B and FIG. 10C, the pinhole light-shielding layer 120 can be realized by the drive circuit layer 152, and at least part of the light-shielding regions 121 of the pinhole light-shielding layer 120 (for example, all the light-shielding regions 121 of the pinhole light-shielding layer 120) may be formed by an opaque structure 1521 (e.g., a metal layer) in the driver circuit layer 152; the hole of the pinhole light-shielding layer 120 may be formed by an opening 1522 in the opaque structure. For example, as shown in FIG. 10B, the imaging layer 110 may be disposed at a side of the base substrate 151 closer to the display array layer 130; for another example, as shown in FIG. 10C, the imaging layer 110 may be disposed at a side of the base substrate away from the display array layer 130.

For example, as shown in FIG. 2A, the display panel 100 may further include an encapsulation layer 150 (e.g., a thin film encapsulation layer 150) disposed between the touch layer 140 and the display array layer 130, thereby alleviating the oxidation of light-emitting diodes caused by the moisture or oxygen in the air. For example, the encapsulation layer 150 can be in direct contact with the touch layer 140. In this case, the touch layer 140 can be directly deposited on the encapsulation layer 150, without the need of providing a base material and an optical adhesive between the touch layer 140 and the encapsulation layer 150, thus the thickness of the display panel 100 can be reduced and the flexibility and/or brightness (at a same driving power) of the display panel 100 can be increased.

For example, as shown in FIG. 2A, according to actual application requirements, the display panel 100 may further include a cover layer 160 disposed at a side of the touch layer 140 away from the imaging layer 110 (e.g., away from the encapsulation layer 150). For example, the cover layer 160 may include a light polarization layer (for example, a circularly polarizing plate) to inhibit the defects of deterioration in contrast and deterioration in display quality which are caused by the reflected light (the reflected light generates as a result of ambient light being reflected by the display panel). For example, the cover layer 160 may further include a cover film material (for example, a cover plate) to protect the light polarization layer and the display panel 100.

The embodiments of the present disclosure further provide an electronic device, for example, the electronic device is a display device with a fingerprint recognition function, or a display device with the fingerprint recognition function and a touch control function, and the electronic device includes the fingerprint recognition device described in any one of the above embodiments.

For example, at least one embodiment of the present disclosure also provides the display device 10 that includes the display panel 100 provided by any one of the embodiments of the present disclosure.

For example, FIG. 11 illustrates an exemplary block diagram of the display device 10 provided by at least one embodiment of the present disclosure. For example, as shown in FIG. 11, the display device 10 includes the display panel 100 provided by any one of the embodiments of the present disclosure. For example, the display device 10 can be any product or component having a display function, such as a mobile phone, a tablet computer, a television, a display, a notebook computer, a digital photo frame, a navigator, and the like. The display device realizes an imaging function.

It should be noted that other necessary components (such as a thin film transistor control device, an image data encoding/decoding device, a row scan driver, a column scan driver, a clock circuit, etc.) of the display panel 100 and the display device 10 may adopt suitable conventional components, which should be understood by those skilled in the art that, be given no repeated descriptions and be not limitative to the present disclosure.

Embodiments of the present disclosure provide the display panel and the display device that can improve the imaging quality.

What are described above is related to the illustrative embodiments of the disclosure only and not limitative to the scope of the disclosure; the scopes of the disclosure are defined by the accompanying claims.

What is claimed is:

1. A display panel, comprising an imaging layer, a pinhole light-shielding layer, a display array layer and a touch layer, wherein
the imaging layer, the display array layer and the touch layer are sequentially disposed;
the pinhole light-shielding layer is between the imaging layer and the touch layer, and comprises light-shielding regions and at least one hole-shaped light-transmitting region that is corresponding to the imaging layer;
the display array layer is configured to emit light from a side of the display array layer away from the imaging layer;
the touch layer comprises touch mesh patterns formed by conductive wires, and at least one of the touch mesh patterns comprises a first mesh corresponding to the hole-shaped light-transmitting region and comprises second meshes outside the first mesh, and a size of the first mesh is larger than sizes of the second meshes; and
the at least one of the touch mesh patterns further comprises an auxiliary mesh wire, and the auxiliary mesh wire is only arranged within the first mesh.

2. The display panel according to claim 1, wherein
the pinhole light-shielding layer is between the imaging layer and the display array layer.

3. The display panel according to claim 1, wherein
an end of the auxiliary mesh wire is connected with the conductive wires forming the first mesh, and another end of the auxiliary mesh wire is suspended.

4. The display panel according to claim 3, wherein
an orthographic projection of the hole-shaped light-transmitting region on the display array layer is within an orthographic projection of the first mesh on the display array layer.

5. The display panel according to claim 3, wherein
a density of the first mesh is smaller than a density of the second meshes.

6. The display panel according to claim 3, wherein
a surface of the conductive wires at a side, of the conductive wires, closer to the imaging layer comprises a plurality of scattering points and the scattering points protrude from or dent into the surface.

7. The display panel according to claim 3, further comprising a base substrate and a drive circuit layer, wherein
the drive circuit layer is between the display array layer and the imaging layer; and
the imaging layer is at any side of the substrate.

8. The display panel according to claim 3, further comprising an encapsulation layer, wherein
the encapsulation layer is between the display array layer and the touch layer, and the encapsulation layer is in direct contact with the touch layer.

9. The display panel according to claim 1, wherein
an orthographic projection of the hole-shaped light-transmitting region on the display array layer is within an orthographic projection of the first mesh on the display array layer.

10. The display panel according to claim 9, wherein
a center of the orthographic projection of the hole-shaped light-transmitting region on the display array layer coincides with a center of the orthographic projection of the first mesh on the display array layer.

11. The display panel according to claim 1, wherein
the display array layer comprises a plurality of display pixels, and an orthographic projection of the hole-shaped light-transmitting region on the display array layer is between adjacent display pixels.

12. The display panel according to claim 11, wherein
orthographic projections of the conductive wires on the display array layer are between adjacent display pixels, respectively.

13. The display panel according to claim 11, wherein
an orthographic projection of each of the second meshes on the display array layer surrounds at least one corresponding display pixel.

14. The display panel according to claim 1, wherein
a density of the first mesh is smaller than a density of the second meshes.

15. The display panel according to claim 1, wherein
a surface of the conductive wires at a side, of the conductive wires, closer to the imaging layer comprises a plurality of scattering points and the scattering points protrude from or dent into the surface.

16. The display panel according to claim 1, further comprising a base substrate and a drive circuit layer, wherein
the drive circuit layer is between the display array layer and the imaging layer; and
the imaging layer is at any side of the substrate.

17. The display panel according to claim 16, wherein
at least a portion of the light-shielding regions of the pinhole light-shielding layer is formed by an opaque structure of the drive circuit layer.

18. The display panel according to claim 1, wherein the touch mesh patterns arranged in an array and in a same layer, or the touch mesh patterns in different layers.

19. The display panel according to claim 1, further comprising an encapsulation layer, wherein the encapsulation layer is between the display array layer and the touch layer, and the encapsulation layer is in direct contact with the touch layer.

20. A display device, comprising the display panel according to claim 1.

* * * * *